(12) United States Patent
Shiraishi

(10) Patent No.: US 10,607,868 B2
(45) Date of Patent: Mar. 31, 2020

(54) MANUFACTURING CELL AND MANUFACTURING CELL MANAGEMENT SYSTEM

(71) Applicant: FANUC CORPORATION, Yamanashi (JP)

(72) Inventor: Wataru Shiraishi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 250 days.

(21) Appl. No.: 15/594,925

(22) Filed: May 15, 2017

(65) Prior Publication Data

US 2017/0330775 A1    Nov. 16, 2017

(30) Foreign Application Priority Data

May 16, 2016  (JP) .................. 2016-098128

(51) Int. Cl.
    *H01L 21/67*    (2006.01)
    *G05B 19/418*    (2006.01)
    *G05B 13/02*    (2006.01)
    *G05B 23/02*    (2006.01)
    (Continued)

(52) U.S. Cl.
CPC ...... *H01L 21/67155* (2013.01); *G05B 13/026* (2013.01); *G05B 19/4184* (2013.01); *G05B 23/02* (2013.01); *G06Q 10/06* (2013.01); *H01L 21/02* (2013.01); *G05B 23/0237* (2013.01);
(Continued)

(58) Field of Classification Search
CPC .. G05B 13/0265; G05B 13/026; G05B 23/02; G05B 23/0237; G05B 19/4184; H01L 21/02; Y02P 90/02; Y02P 90/14; Y02P 90/86
See application file for complete search history.

(56) References Cited

U.S. PATENT DOCUMENTS

2006/0259176 A1  11/2006  Fujii
2009/0297650 A1*  12/2009  Shimizu .................. B29C 45/82
    425/145
2011/0264323 A1  10/2011  Sakakibara et al.
(Continued)

FOREIGN PATENT DOCUMENTS

CN    205177086 U    4/2016
JP    6-162300 A    6/1994
(Continued)

*Primary Examiner* — Sujoy K Kundu
*Assistant Examiner* — Terence E Stifter, Jr.
(74) *Attorney, Agent, or Firm* — Hauptman Ham, LLP

(57) ABSTRACT

A manufacturing cell includes an allowable range setting unit configured to set an allowable range for physical quantity data or statistical processing data, and data output unit configured to output, in a case where the physical quantity data or the statistical processing data deviates from the allowable range, output information. The manufacturing cell further includes an abnormality information determination unit configured to compare the physical quantity data or the statistical processing data of a manufacturing cell as an abnormality source, with the retained physical quantity data or the retained statistical processing data of the manufacturing cell, to determine whether or not the abnormality is inherent to the manufacturing cell as the abnormality source, and a determination result notification unit for notifying a determination result.

10 Claims, 9 Drawing Sheets

(51) Int. Cl.
    *G06Q 10/06*    (2012.01)
    *H01L 21/02*    (2006.01)
(52) U.S. Cl.
    CPC .............. *Y02P 90/02* (2015.11); *Y02P 90/14* (2015.11); *Y02P 90/86* (2015.11)

(56) References Cited

U.S. PATENT DOCUMENTS

| | | | |
|---|---|---|---|
| 2013/0156875 A1* | 6/2013 | Maruyama | B29C 45/84 |
| | | | 425/150 |
| 2014/0246997 A1 | 9/2014 | Suzuki | |
| 2015/0051728 A1 | 2/2015 | Kim et al. | |
| 2016/0293462 A1* | 10/2016 | Matsushita | H01L 22/20 |
| 2017/0003677 A1* | 1/2017 | Hsu | G05B 19/41875 |
| 2017/0083016 A1* | 3/2017 | Imanari | G05B 23/0218 |

FOREIGN PATENT DOCUMENTS

| | | |
|---|---|---|
| JP | H08-202408 A | 8/1996 |
| JP | 2005-33090 A | 2/2005 |
| JP | 2005-346655 A | 12/2005 |
| JP | 2010-286880 A | 12/2010 |
| JP | 5530019 B1 | 6/2014 |
| JP | 6142365 B2 | 6/2017 |
| KR | 101325150 B1 | 11/2013 |

\* cited by examiner

|    | MOLDED PART WEIGHT | QUALITY DETERMINATION $119.1 < M1(n) \leq 120.9$ |
|----|--------------------|--------------------------------------------------|
| 1  | 120.55             | A                                                |
| 2  | 120.56             | A                                                |
| 3  | 120.56             | A                                                |
| 4  | 120.55             | A                                                |
| 5  | 120.56             | A                                                |
| 6  | 120.56             | A                                                |
| 7  | 120.55             | A                                                |
| 8  | 120.55             | A                                                |
| 9  | 120.83             | A                                                |
| 10 | 120.94             | B                                                |
| 11 | 121.03             | B                                                |
| 12 | 121.03             | B                                                |
| 13 | 121.03             | B                                                |
| 14 | 121.02             | B                                                |
| 15 | 121.02             | B                                                |
| 16 | 121.04             | B                                                |
| 17 | 121.03             | B                                                |
| 18 | 121.03             | B                                                |
| 19 | 121.02             | B                                                |
| 20 | 121.03             | B                                                |

A: WITHIN ALLOWABLE RANGE
B: DEVIATED FROM ALLOWABLE RANGE

FIG. 4

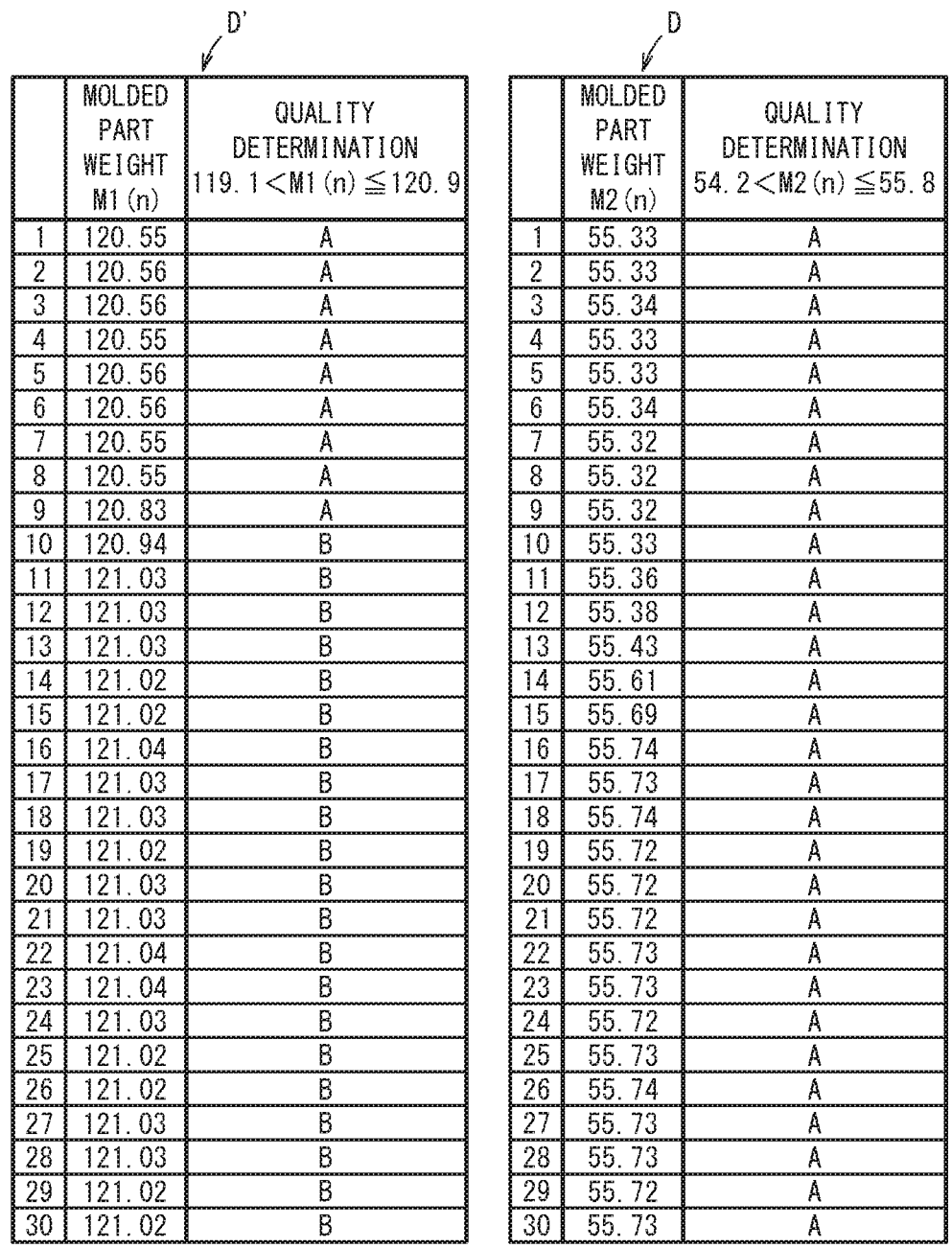

| | MOLDED PART WEIGHT M1(n) | QUALITY DETERMINATION 119.1<M1(n)≦120.9 |
|---|---|---|
| 1 | 120.55 | A |
| 2 | 120.56 | A |
| 3 | 120.56 | A |
| 4 | 120.55 | A |
| 5 | 120.56 | A |
| 6 | 120.56 | A |
| 7 | 120.55 | A |
| 8 | 120.55 | A |
| 9 | 120.83 | A |
| 10 | 120.94 | B |
| 11 | 121.03 | B |
| 12 | 121.03 | B |
| 13 | 121.03 | B |
| 14 | 121.02 | B |
| 15 | 121.02 | B |
| 16 | 121.04 | B |
| 17 | 121.03 | B |
| 18 | 121.03 | B |
| 19 | 121.02 | B |
| 20 | 121.03 | B |
| 21 | 121.03 | B |
| 22 | 121.04 | B |
| 23 | 121.04 | B |
| 24 | 121.03 | B |
| 25 | 121.02 | B |
| 26 | 121.02 | B |
| 27 | 121.03 | B |
| 28 | 121.03 | B |
| 29 | 121.02 | B |
| 30 | 121.02 | B |

| | MOLDED PART WEIGHT M2(n) | QUALITY DETERMINATION 54.2<M2(n)≦55.8 |
|---|---|---|
| 1 | 55.33 | A |
| 2 | 55.33 | A |
| 3 | 55.34 | A |
| 4 | 55.33 | A |
| 5 | 55.33 | A |
| 6 | 55.34 | A |
| 7 | 55.32 | A |
| 8 | 55.32 | A |
| 9 | 55.32 | A |
| 10 | 55.33 | A |
| 11 | 55.36 | A |
| 12 | 55.38 | A |
| 13 | 55.43 | A |
| 14 | 55.61 | A |
| 15 | 55.69 | A |
| 16 | 55.74 | A |
| 17 | 55.73 | A |
| 18 | 55.74 | A |
| 19 | 55.72 | A |
| 20 | 55.72 | A |
| 21 | 55.72 | A |
| 22 | 55.73 | A |
| 23 | 55.73 | A |
| 24 | 55.72 | A |
| 25 | 55.73 | A |
| 26 | 55.74 | A |
| 27 | 55.73 | A |
| 28 | 55.73 | A |
| 29 | 55.72 | A |
| 30 | 55.73 | A |

A: WITHIN ALLOWABLE RANGE
B: DEVIATED FROM ALLOWABLE RANGE

⇩ MOLDED PART WEIGHT OF MANUFACTURING CELL 1
⇩ MOLDED PART WEIGHT OF MANUFACTURING CELL 2

| CORRELATION COEFFICIENT CALCULATION UNIT | | CORRELATION COEFFICIENT R |
|---|---|---|
| | | 0.79 |

MANUFACTURING CELL AND MANUFACTURING CELL MANAGEMENT SYSTEM

CROSS-REFERENCE TO RELATED APPLICATION

This application is based upon and claims the benefit of priority from Japanese Patent Application No. 2016-098128 filed on May 16, 2016, the contents of which are incorporated herein by reference.

BACKGROUND OF THE INVENTION

Field of the Invention

The present invention relates to a manufacturing cell for processing a workpiece in manufacturing and a manufacturing cell management system for the manufacturing cell.

Description of the Related Art

For example, a manufacturing cell for processing a workpiece by injection molding includes a molding machine main body, a mold temperature controller, a dryer, a molded part takeout device, an inserter, a conveyor, a static eliminator, a management computer, etc. If abnormality occurs in any of the components, the abnormality is notified to an operator, e.g., by turning on a warning light. For example, apparatuses disclosed in Japanese Laid-Open Patent Publication No. 06-162300 and Japanese Laid-Open Patent Publication No. 2005-346655 are configured to provide a countermeasure against abnormality for an operator, or automatically cope with abnormality.

Further, in factories of this type, similar processing is carried out using a plurality of manufacturing cells. Examples of similar processing in injection molding include use of the same resin, the same resin grade, the same cavity shape, the mold temperature controller having the same system, the same dryer, the molded part takeout device of the same model by the manufacturing cells, and installation of the manufacturing cells in the same clean room. Further, the examples of the similar processing may include common manufacturing conditions, common facility/equipment conditions, common environment conditions, etc. In this case, manufacturing may be performed in different factories.

In this regard, if abnormality occurs in any of the manufacturing cells which perform similar processing, the similar abnormality may occur in other manufacturing cells. However, it is laborious for the operator to inspect the plurality of manufacturing cells one by one. In an attempt to address the problem, the system disclosed in Japanese Laid-Open Patent Publication No. 2005-033090 determines whether each device is normal or abnormal based on the differences in data among devices which carry out the same manufacturing process. However, in the system, significant differences occur in the similar processing which adopts different manufacturing processes. Therefore, this system cannot be used for abnormal determination of the manufacturing cell which performs similar processing.

SUMMARY OF THE INVENTION

The present invention has been made taking the above circumstances, and an object of the present invention is to provide a manufacturing cell and a manufacturing cell management system in which when abnormality occurs in a manufacturing cell, it is possible to automatically make an abnormality determination even in a manufacturing cell which is not the manufacturing cell at which the abnormality occurred, and recognize, and notify occurrence of similar abnormality or a sign, etc. of abnormality efficiently.

In order to achieve the above object, a manufacturing cell of the present invention includes an allowable range setting unit configured to set an allowable range for at least one of physical quantity data related to the manufacturing cell and statistical processing data obtained by statistically processing the physical quantity data, a data output unit configured to output to another manufacturing cell or a manufacturing cell management system, output information including at least one of notification of occurrence of abnormality, the physical quantity data, and the statistical processing data, in a case where the physical quantity data or the statistical processing data deviates from the allowable range, an abnormality information determination unit configured to compare the physical quantity data or the statistical processing data of another manufacturing cell as an abnormality source which outputted the output information, with the retained physical quantity data or the retained statistical processing data of the manufacturing cell, to determine whether or not the abnormality is inherent to the manufacturing cell as the abnormality source, and a notification unit configured to notify a result determined by the abnormality information determination unit.

In the invention as described above, when the physical quantity data or the statistical processing data deviates from the allowable range, the output information is outputted to the other manufacturing cells or the manufacturing cell management system by the allowable range setting unit and the data output unit. In this manner, it becomes possible to share information about the occurrence of abnormality within the system. Further, in the manufacturing cell, the abnormality information determination unit and the notification unit determine whether or not the abnormality is inherent to the manufacturing cell as the abnormality source which outputted the output information, and notify the determination result. In this manner, it is possible to determine the occurrence of similar abnormality and a sign, etc. of abnormality automatically, and notify the information to the operator. Therefore, the workload of inspection by the operator is reduced significantly, and it is possible to cope with the abnormality at early time. Thus, the manufacturing cell can machine the workpiece much more accurately and stably.

In this case, the abnormality information determination unit may be configured to determine whether at least one of the physical quantity data and the statistical processing data deviating from the allowable range of the manufacturing cell as the abnormality source is similar to the retained physical quantity data or the retained statistical processing data of the manufacturing cell based on a correlation coefficient.

As described above, the abnormality information determination unit determines whether the abnormality is inherent to the manufacturing cell as the abnormality source or the abnormality is similar abnormality based on the correlation coefficient to detect the sign of abnormality at much earlier time. Thus, it becomes possible to perform maintenance operation of the manufacturing cell at an early stage, and suppress manufacturing failures, etc.

Further, preferably, the abnormality information determination unit is configured to extract, and compare the physical quantity data within a predetermined range before and after a time at which the output information was outputted, or before and after processing timing at which the abnormality occurred.

As described above, the abnormality information determination unit extracts, and compares the physical quantity data within a predetermined range before and after the time at which the output information was outputted or before and after processing timing at which the abnormality occurred. In this manner, it is possible to reliably detect whether the abnormality is inherent to the manufacturing cell as the abnormality source or the abnormality is similar abnormality.

In this regard, the manufacturing cell may further include an abnormality occurrence warning unit configured to output abnormality occurrence warning to the other manufacturing cell or the manufacturing cell management system when the abnormality information determination unit determines that abnormality similar to the abnormality of the manufacturing cell as the abnormality source occurs.

As described above, the manufacturing cell includes the abnormality occurrence warning unit. Therefore, also in the other manufacturing cell or the manufacturing cell management system, information about the occurrence of similar abnormality is shared, and the information can be used for determination of the cause of the abnormality or maintenance operation.

Further, a molding material information acquisition unit may be provided to obtain molding material information which is used by the abnormality information determination unit for determination of abnormality.

As described above, the manufacturing cell includes the molding material information acquisition unit. Therefore, at the time of determination of abnormality by the abnormality information determination unit, it is possible to take the relevancy of the molding material information into account, and determine abnormality based on the molding material information further accurately.

Further, the manufacturing cell may comprise an abnormality data storage unit configured to store the physical quantity data or the statistical processing data of the manufacturing cell as the abnormality source, and the abnormality information determination unit may compare historical physical quantity data or statistical processing data stored by the abnormality data storage unit with the retained physical quantity data or the retained statistical processing data of the manufacturing cell.

As described above, the abnormality information determination unit stores the historical physical quantity data or the historical statistical processing data. In this manner, it is possible to determine the occurrence of abnormality or the sign of abnormality at early time, based on the relevancy between the abnormality occurred in the past and the current change in the data.

Further, the manufacturing cell may include an extraction target data storage unit configured to set, and store related data for comparison with data of the other manufacturing cell when the physical quantity data or the statistical processing data deviates from the allowable range, and the data output unit may be configured to output the output information based on the data deviating from the allowable range and the related data.

As described above, the manufacturing cell includes the extraction target data storage unit. Thus, it is possible to limit the data as the target of comparison, and outputs the output information to the other manufacturing cell and/or the manufacturing cell management system. Accordingly, it is possible to achieve reduction of the amount of transferred data, and increase the speed of analysis and determination of the data.

Further, in order to achieve the above object, a manufacturing cell management cell of the present invention includes a plurality of manufacturing cells and a management computer configured to manage the plurality of manufacturing cells in an integrated manner, and the manufacturing cell management system includes an allowable range setting unit configured to set an allowable range for at least one of physical quantity data related to the manufacturing cell and statistical processing data obtained by statistically processing the physical quantity data, a data output unit configured to output to another manufacturing cell or the management computer, output information including at least one of notification of occurrence of abnormality, the physical quantity data, and the statistical processing data, in a case where the physical quantity data or the statistical processing data deviates from the allowable range, an abnormality information determination unit configured to compare the physical quantity data or the statistical processing data of another manufacturing cell as an abnormality source which outputted the output information, with the retained physical quantity data or the retained statistical processing data of the manufacturing cell, to determine whether or not the abnormality is inherent to the manufacturing cell as the abnormality source, and a notification unit configured to notify a result determined by the abnormality information determination unit. The management computer includes at least one of the allowable range setting unit, the data output unit, the abnormality information determination unit, and the notification unit.

In this case, preferably, the abnormality information determination unit determines whether at least one of the physical quantity data and the statistical processing data deviating from the allowable range of the manufacturing cell as the abnormality source is similar to the retained physical quantity data or the retained statistical processing data of the manufacturing cell based on a correlation coefficient.

Further, the abnormality information determination unit may be configured to extract, and compare the physical quantity data within a predetermined range before and after a time at which the output information was outputted, or before and after processing timing at which the abnormality occurred.

In the present invention, when abnormality occurs in a manufacturing cell, the manufacturing cell and the manufacturing cell management system can automatically make an abnormality determination even in a manufacturing cell which is not the manufacturing cell at which the abnormality occurred, and recognize, and notify occurrence of similar abnormality or a sign, etc. of abnormality efficiently.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 4 is a table conceptually showing calculation of a correlation coefficient from comparison data of another manufacturing cell and own data of an own manufacturing cell;

DESCRIPTION OF THE PREFERRED EMBODIMENTS

Hereinafter, preferred embodiments of a manufacturing cell and a manufacturing cell management cell system according to the present invention will be described in detail with reference to the accompanying drawings.

Figure 1:
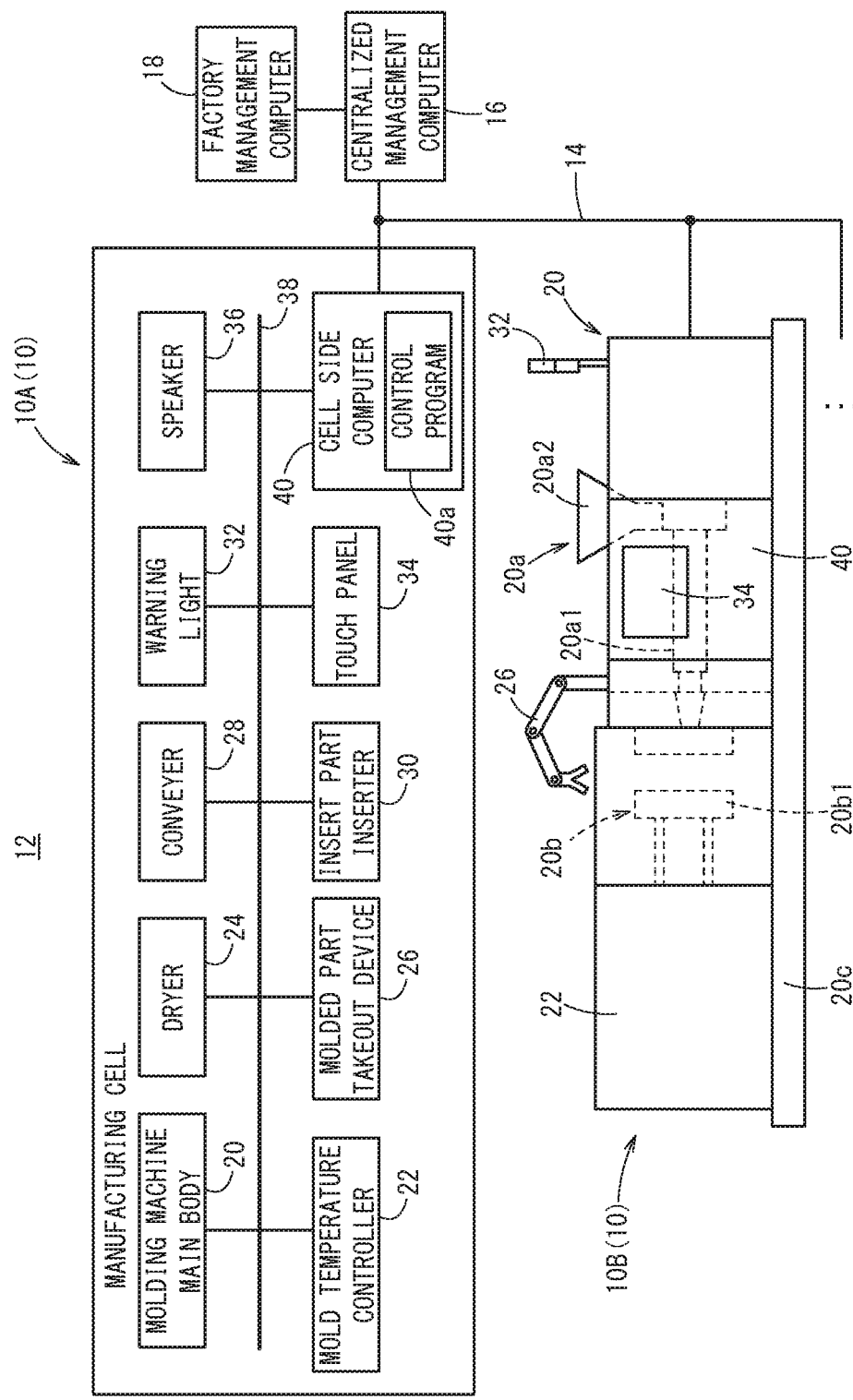
FIG. 1 is a diagram showing overall structure of a manufacturing cell and a manufacturing cell management system according to an embodiment of the present invention.

As shown in FIG. 1, a manufacturing cell 10 is formed by combining a plurality of types of components (mechanical mechanism, electrical mechanism, etc.). The respective components function cooperatively to process a workpiece in manufacturing. In a factory for processing workpieces, a plurality of manufacturing cells 10 of this type are provided.

A manufacturing cell management system 12 manages processing of the workpieces in the factory in an integrated manner. To this end, the manufacturing cell management system 12 comprises a network system formed by connecting the manufacturing cells 10 by a LAN 14, etc. in a manner that information can be exchanged among the manufacturing cells 10. This manufacturing cell management system 12 includes a centralized management computer 16 for managing a plurality of manufacturing cells 10, and a factory management computer 18 connected to the centralized management computer 16 for managing the entire factory (production line, etc.). The factory management computer 18 may have a function of a server or be used for cloud-computing, in the factory.

In the factory, each of the manufacturing cells 10 is configured to carry out similar processing. The "similar processing" herein means that a certain level of similarity is present in processing. Examples of the similar processing include the cases where the same material is used in molding, the grade of the material is the same, the physical property of the material is partially the same, the molding conditions are partially the same or totally the same, components of the manufacturing cell 10 are partially the same or totally the same, and the environment where the manufacturing cell 10 is installed is the same. Even if processing is performed in different factories, as long as any of the above conditions are satisfied, the processing may be considered as the similar processing Hereinafter, as a typical example, the manufacturing cell 10 used in an injection molding application for performing injection molding will be described. It is a matter course that the manufacturing cell 10 is not limited to the injection molding application. For example, the present invention may be applicable to various types of manufacturing cells 10 used for other molding, cutting, grinding, joining, assembling.

The manufacturing cell 10 used in the injection molding includes a molding machine main body 20 as a main component. Further, as peripheral devices of the molding machine main body 20, for example, a mold temperature controller 22, a dryer 24, a molded part takeout device 26, a conveyer 28, an insert part inserter 30, a warning light 32, a touch panel 34, and a speaker 36 are provided. Further, the manufacturing cell 10 includes a cell side computer 40 for retrieving and processing information of components in the manufacturing cell 10 to control the components. The molding machine main body 20, the mold temperature controller 22, the dryer 24, the molded part takeout device 26, the conveyer 28, the insert part inserter 30, the warning light 32, the touch panel 34, and the speaker 36 are connected to one another by a communication wire 38 such as CSMA/CD for allowing the information to be exchanged among the components.

Hereinafter, for the purpose of brevity, among the plurality of manufacturing cells 10, a manufacturing cell 10 which is described as a representative manufacturing cell will also be referred to as an own manufacturing cell 10A, and a manufacturing cell 10 which is different from the own manufacturing cell 10A will also be referred to as the "other manufacturing cell 10B". The own manufacturing cell 10A and the other manufacturing cell 10B perform similar injection molding (processing in manufacturing). For example, the similar injection molding means the use of the same resin material, the same resin grade, the same cavity shape, the mold temperature controller 22 of the same type, the same dryer 24, the molded part takeout device 26 of the same model, installation of the manufacturing cell 10 in the same clean room, common molding conditions, common equipment conditions, and/or common environmental conditions.

The molding machine main body 20 includes an injection part 20a, a mold clamping part 20b, and a machine frame 20c. The injection part 20a transports resin material (pellet), melts the resin material by heating, and injects the melted resin from a nozzle 20a1. The mold clamping part 20b allows the melted resin from the injection part 20a to flow into a cavity of a mold 20b1 which is opened/closed to form the workpiece by molding. The injection part 20a and the mold clamping part 20b are provided on the machine frame 20c. Drive control of the injection part 20a and the mold clamping part 20b is implemented by the cell side computer 40. It should be noted that the molding machine main body 20 may have a control device for implementing the drive control, separately from the cell side computer 40.

The mold temperature controller 22 controls the flow of water and oil having the controlled temperature to regulate, and stabilize the temperature of the mold 20b1. The dryer 24 dries the resin material beforehand, and supplies the dried resin material to a hopper 20a2 of the injection part 20a of the molding machine main body 20. The molded part takeout device 26 takes out the molded part (workpiece) from the cavity when the mold 20b1 is opened. The workpiece taken out by the molded part takeout device 26 is placed on the conveyer 28. The conveyer 28 transports the workpiece to the next processing step. The insert part inserter 30 positions an insert part in the cavity of the mold

20b1, and performs insert molding at the time of injection molding of the melted resin. Further, the warning light 32, the touch panel 34, and the speaker 36 notify the operator of the drive state, abnormality, replacement of consumables, maintenance, etc. of components of the manufacturing cells 10.

It should be noted that the manufacturing cell 10 may not have all of the above described peripheral devices, but may selectively have components as necessary. For example, in the case where insert molding is not performed, the insert part inserter 30 may not be provided. Further, for example, in the case where the workpiece is taken out manually, the molded part takeout device 26 may not be provided. Further, the plurality of manufacturing cells 10 may have common peripheral devices. For example, one dryer 24 may be connected to a plurality of molding machine main bodies 20 (manufacturing cells 10) to supply the dried same resin material to each of the molding machine main bodies 20.

Figure 2:
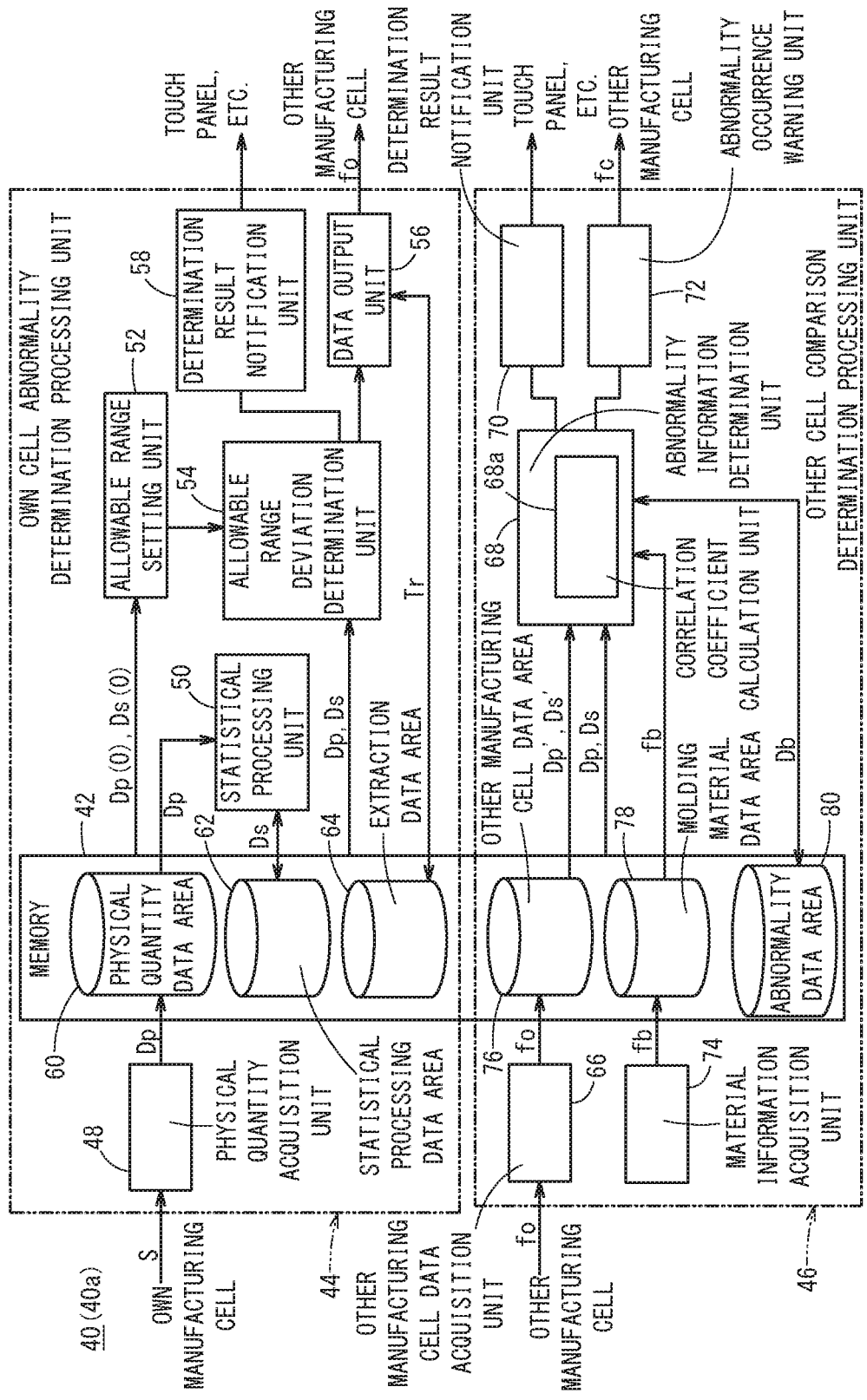
FIG. 2 is a functional block diagram showing structure of the manufacturing cell in FIG. 1.

The cell side computer 40 is a computer made up of components such as an input/output interface (not shown), a processor, and a memory 42 (see FIG. 2). The warning light 32, the touch panel 34, and the speaker 36 may be connected to the input/output interface of the cell side computer 40. Further, the plurality of manufacturing cells 10 are connected to cell side computers 40 of the other manufacturing cells 10 or the centralized management computer 16 through the LAN 14 for exchanging information.

A control program 40a to be executed at the time of controlling the manufacturing cell 10 is stored in the memory 42 of the cell side computer 40. A processor of the cell side computer 40 executes this control program 40a to perform functions of an injection molding control unit (not shown), and as shown in FIG. 2, an own cell abnormality determination processing unit 44, and an other cell comparison determination processing unit 46.

The injection molding control unit is a functional unit configured to control each of the components (molding machine main body 20 and peripheral devices) of the manufacturing cell 10 to perform injection molding of the workpiece. The own cell abnormality determination processing unit 44 is a functional unit configured to determine the occurrence of abnormality of the own manufacturing cell 10A by detecting the state of each of the components of the own manufacturing cell 10A. The other cell comparison determination processing unit 46 is a functional unit configured to determine whether or not similar abnormality occurs in the own manufacturing cell 10A based on information of the other manufacturing cell 10B at which abnormality occurred (abnormality source) and information of the own manufacturing cell 10A.

Specifically, the own cell abnormality determination processing unit 44 includes a physical quantity acquisition unit 48, a statistical processing unit 50, an allowable range setting unit 52 (allowable range setting means), an allowable range deviation determination unit 54, a data output unit 56 (data output means), and a determination result notification unit 58. Further, the own cell abnormality determination processing unit 44 includes a physical quantity data area 60, a statistical processing data area 62, and an extraction data area 64 (extraction target data storage means) in the memory 42.

The physical quantity acquisition unit 48 receives a signal fed back from each of the components of the own manufacturing cell 10A, signals of sensors and inspection devices, etc. (not shown) in the own manufacturing cell 10A, and then, stores physical quantity data Dp in the physical quantity data area 60 based on these signals S. The physical quantity acquisition unit 48 may calculate the physical quantity data Dp as necessary from the obtained signals S. Examples of the items (types) of the physical quantity at the time of injection molding include, though not limited to, the weight of the molded part, the size of the molded part, the screw rotation torque, the screw rotation position, the injection speed of melted resin, the nozzle temperature, the mold temperature, the mold clamping force, the movable mold position, and the degree of opening of the mold 20b1, etc. The timing of obtaining the physical quantity data Dp is every one shot (one molding) or every predetermined shot count (every predetermined number of shots).

Further, the physical quantity data area 60 stores, in addition to physical quantity data Dp obtained by the physical quantity acquisition unit 48, reference physical quantity data Dp(0) as a reference used in injection molding to be performed. The physical quantity data Dp(0) may be determined based on inputs from an operator or statistical processing. For example, as shown in FIG. 3A, 120 g is stored as reference physical quantity data M1(0) of the molded part weight which is an item of the reference physical quantity data Dp(0) of the own manufacturing cell 10A.

Referring back to FIG. 2, the statistical processing unit 50 performs statistical processing of the physical quantity data Dp stored in the physical quantity data area 60 to generate statistical processing data Ds, and store the generated statistical processing data Ds in the statistical processing data area 62 of the memory 42. In statistical processing, the average value, the maximum value, the minimum value, deviation, regularity, irregularity, etc. are calculated, or extracted from a plurality of pieces of physical quantity data Dp in the same item. By performing statistical processing as described above, for example, in the case where the number of data pieces of the physical quantity data Dp is very large, the number of data pieces can be reduced, and it is possible to achieve reduction of the data transfer quantity, and increase the speed of processing. Further, also in the statistical processing data area 62, in addition to the statistical processing data Ds used in statistical processing by the statistical processing unit 50, reference statistical processing data Ds(0) used as a reference in injection molding is stored.

The allowable range setting unit 52 reads reference physical quantity data Dp(0) of the physical quantity data area 60 or the reference statistical processing data Ds(0) of the statistical processing data area 62 on the item by item basis, and sets the allowable range (allowable range information) based on these kinds of data. At this time, for example, the allowable range setting unit 52 applies a predetermined numeric range to the reference physical quantity data Dp(0) or the reference statistical processing data Ds(0), or sets the allowable range by automatically changing the range in correspondence with values of the plurality of pieces of the physical quantity data Dp and/or the statistical processing data Ds.

Figures 3A, 3B:
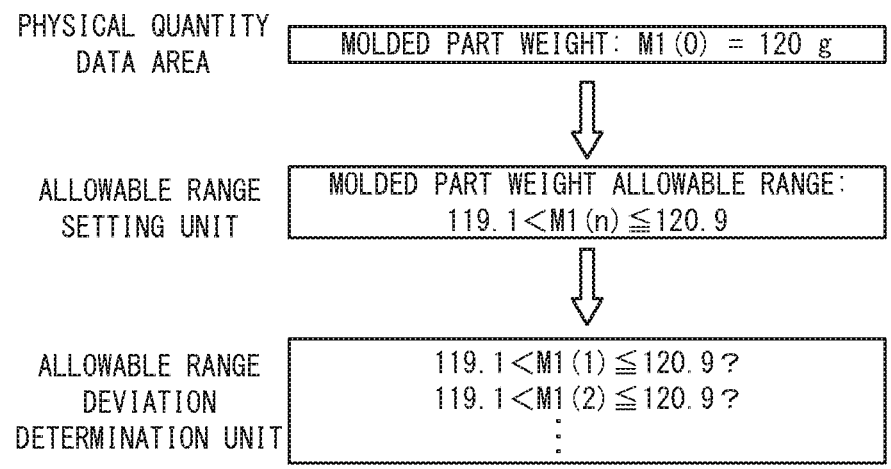
FIG. 3A shows a flow of setting an allowable range of physical quantity data and determining deviation from the allowable range.
FIG. 3B is a table showing results of determining the molded part weight by multiple shots.

For example, as shown in FIG. 3A, in the case where the reference physical quantity data M1(0) of the molded part weight is 120 g, the allowable range setting unit 52 sets an allowable range having the minimum value of 119.1 g and the maximum value of 120.9 g. Then, the allowable range setting unit 52 sets an allowable range for all of the physical quantity data Dp and the statistical processing data Ds related to injection molding, and provides this allowable range for the allowable range deviation determination unit 54.

The allowable range deviation determination unit 54 reads the physical quantity data Dp or the statistical processing data Ds stored in the physical quantity data area 60 or the statistical processing data area 62, and determines whether or not the physical quantity data Dp and the statistical processing data Ds are within the preset allowable ranges of the respective items. That is, if the physical quantity data Dp or the statistical processing data Ds is within the allowable range, in injection molding, it can be presumed that no abnormality is present in the contents related to the physical quantity. Conversely, if the physical quantity data Dp or the statistical processing data Ds deviates from the allowable range, in injection molding, it can be presumed that abnormality has occurred in the contents related to the physical quantity.

The allowable range deviation determination unit 54 makes a deviation determination for the physical quantity data Dp and/or the statistical processing data Ds of each item at every one shot. In this manner, it is possible to detect abnormality of the manufacturing cell 10 in real time. Alternatively, the determination by the allowable range deviation determination unit 54 may be made at one time when the physical quantity data Dp for multiple shots is accumulated.

For example, as shown in FIG. 3B, if 119.1 g<M1($n$) ≤120.9 g is set as an allowable range of the molded part weight of the own manufacturing cell 10A, the allowable range deviation determination unit 54 determines whether or not the molded part weight per one shot is within the allowable range. In this case, n denotes the shot count. In FIG. 3B, it is determined that the physical quantity data M1($n$) of the molded part weight falls within the allowable range until 9th shot, and falls outside the predetermined range from 10th shot.

Referring back to FIG. 2, if the allowable range deviation determination unit 54 determines that the physical quantity data Dp or the statistical processing data Ds deviates from the allowable range, the data output unit 56 notifies the occurrence of abnormality in the own manufacturing cell 10A to the other manufacturing cell 10B or the centralized management computer 16. At this time, the data output unit 56 generates output information fo including at least one of notification of the occurrence of abnormality, the physical quantity data Dp and the statistical processing data Ds having abnormality, and outputs the output information fo to the outside.

In the case where the output information fo includes the physical quantity data Dp and/or the statistical processing data Ds, in the other manufacturing cell 10B and/or in the other cell comparison determination processing unit 46 of the centralized management computer 16, the physical quantity data Dp and/or the statistical processing data Ds are used for determination, etc. of abnormality. Therefore, it is preferable that the output information fo is generated to include the physical quantity data Dp and/or the statistical processing data Ds for a predetermined shot count (e.g., 30 shots as shown in FIG. 4) before and after the time at which abnormality is detected (time at which the output information fo was outputted) or before and after the processing timing at which the abnormality occurred.

Further, when the physical quantity data Dp and/or the statistical processing data Ds deviate from the allowable range, the own cell abnormality determination processing unit 44 stores a reference table Tr (related data) indicating the physical quantity data Dp or the statistical processing data Ds related to the deviated item in the extraction data area 64 beforehand. Then, the data output unit 56 refers to the reference table Tr in accordance with determination of deviation and selectively uses data required for determining abnormality in the other manufacturing cell 10B to generate the output information fo. As an example, in the case where the physical quantity data M1($n$) of the molded part weight of the own manufacturing cell 10A deviates from the allowable range, the data output unit 56 refers to the reference table Tr of the extraction data area 64 to extract molding material information and molded part size, etc. from the physical quantity data area 60. It should be noted that the data output unit 56 may generate output information fo including the physical quantity data Dp and the statistical processing data Ds of all the items stored in the memory 42.

Further, the determination result notification unit 58 notifies the determination result of the allowable range deviation determination unit 54 to the operator. For example, in the case where it is determined that abnormality of the own manufacturing cell 10A has occurred, for example, the determination result notification unit 58 turns on the warning light 32, displays the notification on the touch panel 34, and/or outputs sounds from the speaker 36.

The other cell comparison determination processing unit 46 includes an other manufacturing cell data acquisition unit 66, an abnormality information determination unit 68 (abnormality information determination means), a determination result notification unit 70 (notification means), an abnormality occurrence warning unit 72 (abnormality occurrence warning means), and a material information acquisition unit 74 (molding material information acquisition means). Further, other cell comparison determination processing unit 46 includes an other manufacturing cell data area 76, a molding material data area 78, an abnormality data area 80 (abnormality data storage means) in the memory 42.

The other manufacturing cell data acquisition unit 66 receives output information fo of the other manufacturing cell 10B transmitted through the LAN 14, and stores this output information fo in the other manufacturing cell data area 76 of the memory 42. Further, if only notification of the occurrence of abnormality is present in the output information fo, the other manufacturing cell data acquisition unit 66 accesses the other manufacturing cell 10B to obtain the required data based on the output information fo.

The abnormality information determination unit 68 compares the physical quantity data Dp' or the statistical processing data Ds' of the other manufacturing cell 10B stored in the other manufacturing cell data area 76 (hereinafter also referred to as the comparison data D', collectively) with the physical quantity data Dp or the statistical processing data Ds stored in the physical quantity data area 60 or the statistical processing data area 62 (hereinafter also referred to the own data D, collectively) to determine the occurrence of abnormality or a sign of abnormality in the own manufacturing cell 10A. In particular, in the embodiment of the present invention, the relevance (correlation) between the comparison data D' of the other manufacturing cell 10B at which abnormality occurred and the own data D of the own manufacturing cell 10A is verified. Thus, it becomes possible to suitably determine whether abnormality of the other manufacturing cell 10B is similar abnormality which could occur in the own manufacturing cell 10A or abnormality which is inherent to the other manufacturing cell 10B at which abnormality occurred.

Therefore, the abnormality information determination unit 68 reads the own data D (physical quantity data Dp or the statistical processing data Ds) of the own manufacturing cell 10A based on the item of the comparison data D' of the other manufacturing cell 10B at which abnormality occurred, the shot count, the time, etc. Then, a correlation coefficient calculation unit 68a in the abnormality information determination unit 68 calculates a correlation coefficient R based on the comparison data D' of the other manufacturing cell 10B and the read own data D by a known correlation coefficient calculation method.

This correlation efficient R is calculated in a range of $-1 \leq R \leq 1$. As the correlation coefficient R gets closer to $-1$ or 1, the own data D of the own manufacturing cell 10A is more correlated with the comparison data D' of the other manufacturing cell 10B at which abnormality occurred. Therefore, in the case where calculated coefficient R is outside the predetermined range (e.g., $R \geq 0.7$ or $R \leq -0.7$, i.e., $0.7 \leq |R| \leq 1.0$), the abnormality information determination unit 68 determines that abnormality has occurred also in the own manufacturing cell 10A, or there is a sign of abnormality. Conversely, in the case where the correlation coefficient R falls within the predetermined range (e.g., $-0.7 < R < 0.7$, i.e., $0 \leq |R| < 0.7$), the abnormality information determination unit 68 determines that the abnormality is inherent to the other manufacturing cell 10B at which abnormality occurred.

For example, as shown in FIG. 4, the abnormality information determination unit 68 reads comparison data D' (physical quantity data M1(n) of the molded part weight) of the other manufacturing cell 10B and the own data D (physical quantity data M2(n) of the molded part weight) of the own manufacturing cell 10A. In this case, since all the items of the physical quantity data M2(n) of the molded part weight of the own data D are within the allowable range, no abnormality is detected by the own cell abnormality determination processing unit 44 of the own manufacturing cell 10A. In the meanwhile, the physical quantity data M1(n) of the molded part weight of the comparison data D' is obtained as data which deviates from the allowable range from the 10th shot.

Then, the correlation coefficient calculation unit 68a calculates the correlation coefficient R based on the physical quantity data M1(n) of the molded part weight of the comparison data D' and the physical quantity data M2(n) of the molded part weight of the own data D. Thus, as can be seen from FIG. 4, in the case where the high correlation coefficient R of 0.79 is obtained by calculation, correlation between the comparison data D' and the own data D is high, and it can be presumed that the similar abnormality occurs also in the own manufacturing cell 10A.

Figure 5:
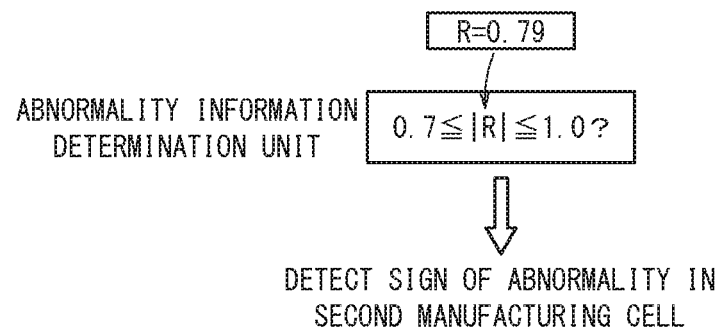
FIG. 5 conceptually shows determination of abnormality based on the correlation coefficient in an abnormality information determination unit.
Figure 6:
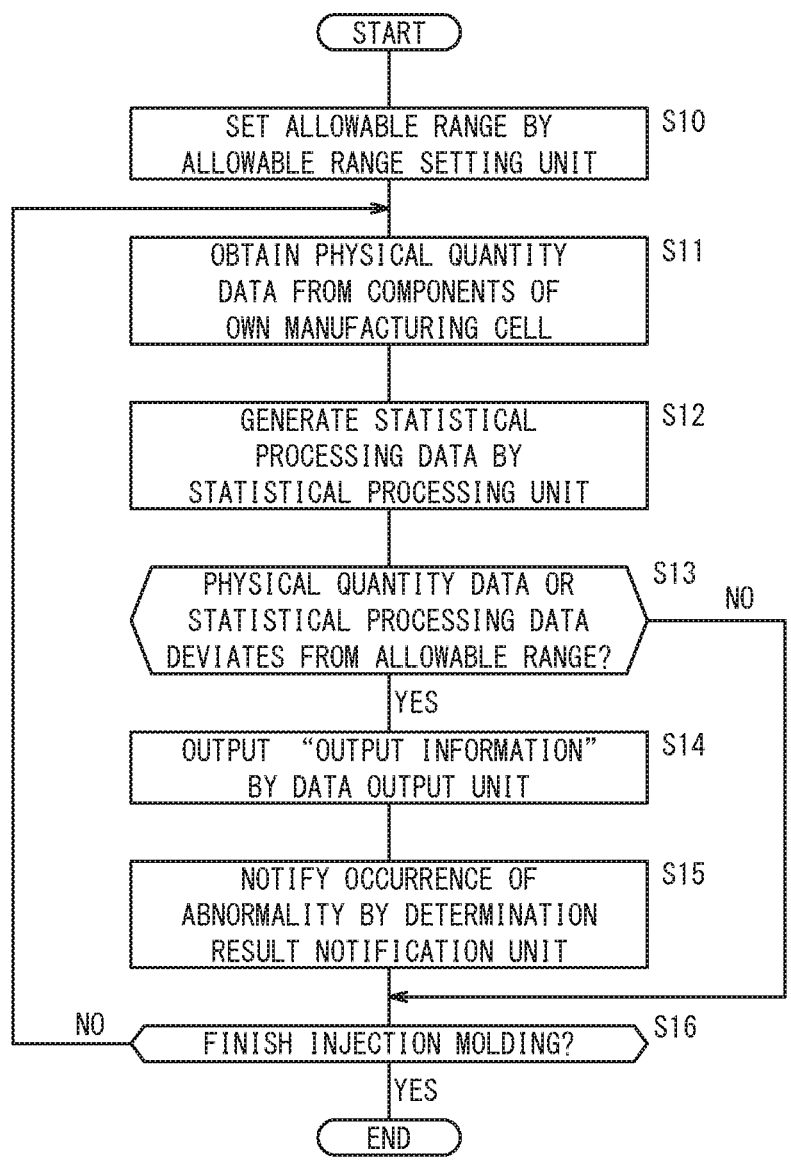
FIG. 6 is a flow chart showing an abnormality determination method in an own cell abnormality determination processing unit.
Figure 7:
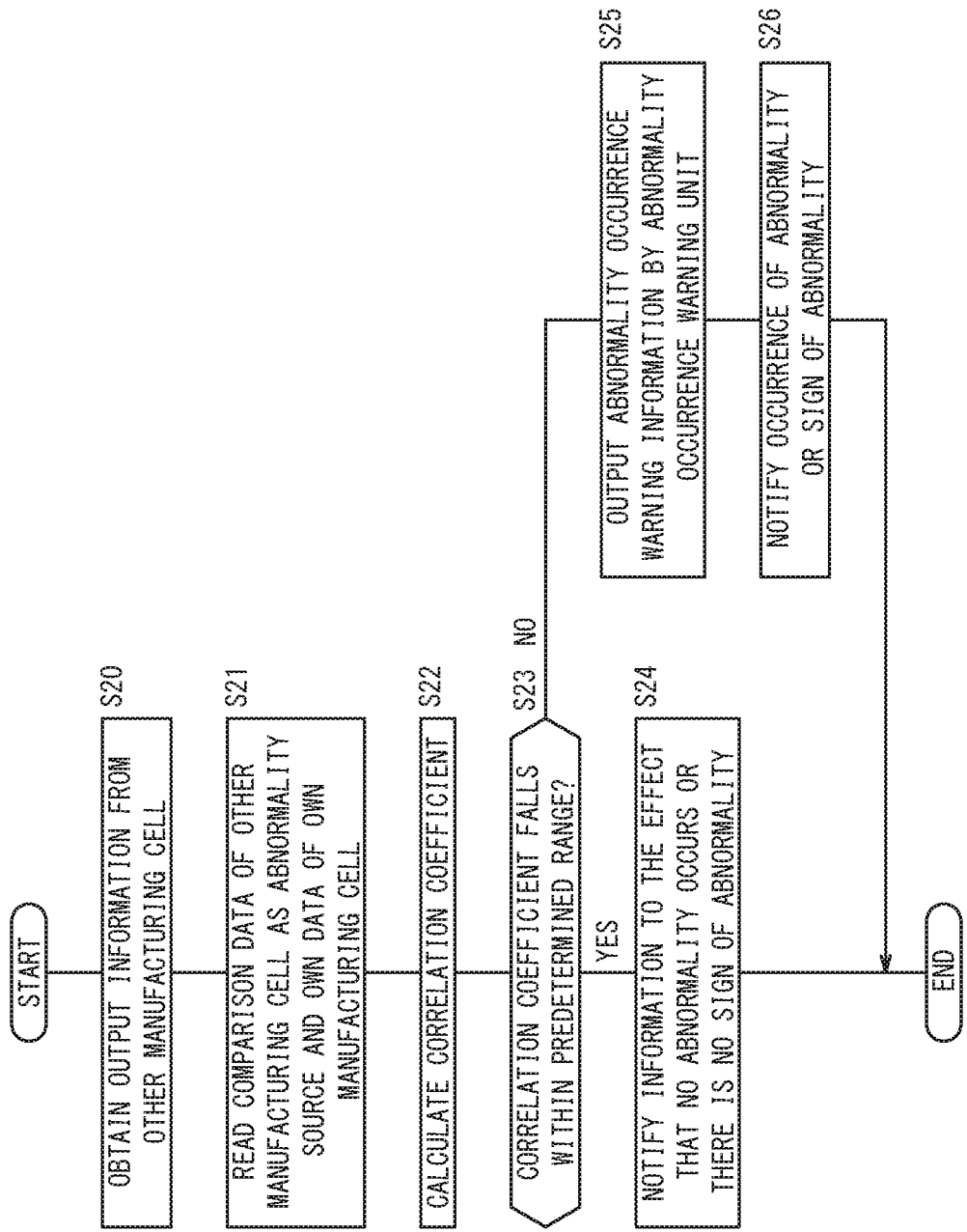
FIG. 7 is a flow chart showing an abnormality determination method in an other cell comparison determination processing unit.

Therefore, as shown in FIG. 5, the other cell comparison determination processing unit 46 compares the calculated correlation coefficient R (=0.79) with the predetermined range. If the other cell comparison determination processing unit 46 determines that the calculated correlation coefficient R falls outside the predetermined range (e.g., $0.7 \leq |R| \leq 1.0$), it notifies this information to the operator, etc.

The determination result notification unit 70 notifies the determination result of the abnormality information determination unit 68 to the operator. If the abnormality information determination unit 68 determines that abnormality occurs in the own manufacturing cell 10A or there is a sign of abnormality in the own manufacturing cell 10A, for example, the determination result notification unit 70 turns on the warning light 32, displays the notification on the touch panel 34, and/or outputs sounds from the speaker 36. Further, if abnormality has not occurred or there is no sign of abnormality, information to the effect that the own manufacturing cell 10A is normal may be notified using the touch panel 34, etc.

In the case where the abnormality information determination unit 68 determines that abnormality has occurred in the own manufacturing cell 10A or there is a sign of abnormality in the own manufacturing cell 10A, the abnormality occurrence warning unit 72 generates this information as abnormality occurrence warning information fc, and transmits the abnormality occurrence warning information fc to the other manufacturing cell 10B or the centralized management computer 16 through the LAN 14. Therefore, abnormality determination of the own manufacturing cell 10A is shared by the other manufacturing cell 10B and the centralized management computer 16. The centralized management computer 16 can take a countermeasure against abnormality, for example, may stop operation of the entire manufacturing cell 10.

Further, the material information acquisition unit 74 displays a screen prompting the operator to input information of molding material such as the grade and the lot number of the molding material used in the manufacturing cell 10, on the touch panel 34, and stores the molding material information fb inputted by the operator in the molding material data area 78. This molding material information fb is used when the abnormality information determination unit 68 compares the comparison data D' of the other manufacturing cell 10B with the own data D of the own manufacturing cell 10A.

That is, the abnormality information determination unit 68 analyzes the relevance of the resin grade, the lot number, etc. of the molding material between the other manufacturing cell 10B at which abnormality occurred and the own manufacturing cell 10A. In this manner, it becomes possible to improve the accuracy of determination of the similar abnormality. For example, the abnormality information determination unit 68 identifies that the other manufacturing cell 10B at which abnormality occurred and the own manufacturing cell 10A have the same resin grade. In this manner, it is presumed that abnormality occurred as shown in FIG. 4 is phenomenon resulting from the change in the molded part weight. Thus, for example, with regard to the abnormally occurred currently, it is possible to presume that the abnormality results from the change of the resin lot. As described above, in the manufacturing cell management system 12, even in the case where it is difficult to determine the cause of the abnormality in a single manufacturing cell 10, it becomes possible to effectively determine the cause at early time by using the molding material information fb.

Further, the other cell comparison determination processing unit 46 may have an abnormality data area 80 for storing the physical quantity data Dp and the statistical processing data Ds resulting from the occurrence of abnormality in the past (hereinafter, collectively also referred to as the historical data Db). The historical data Db may include the physical quantity data Dp and the statistical processing data Ds when the own manufacturing cell 10A has detected abnormality, in addition to the comparison data D' of the other manufacturing cell 10B at which abnormality occurred.

Therefore, the abnormality information determination unit 68 compares the historical data Db resulting from the occurrence of abnormality in the past with the current own data D, and if the own data D moves (changes) in a manner that the movement is related to the abnormality occurred in the past, it is possible to make a determination about abnormality which occurs currently in the own manufacturing cell 10A. If occurrence of abnormality which is similar to that occurred in the past is detected, this information is notified to the operator. In this manner, it becomes possible to detect abnormality of the manufacturing cell 10 at early time.

For example, with regard to the occurrence of abnormality in the past, data of cases where increase in the injection pressure had been observed before the mold protection alarm was generated (physical quantity data Dp or statistical processing data Ds) is stored as historical data Db. Then, when the abnormality occurs currently, the abnormality information determination unit 68 makes a comparison with the historical data Db. When the abnormality information determination unit 68 detects the increase in the injection pressure, the abnormality information determination unit 68 presumes that the mold protection alarm is generated based on the cases in the past, and notifies the presumption result by the determination result notification unit 70 and the abnormality occurrence warning unit 72. In this manner, it becomes possible to instruct the operator to carry out the maintenance operation of the mold 20b1 before the mold protection alarm is generated. It should be noted that the historical data Db at the time of occurrence of abnormality in the past may not be stored in the memory 42 in each manufacturing cell 10. Alternatively, the historical data Db may be stored in a storage medium such as an external HDD which is provided independently from the cell side computer 40, or in a cloud server, etc. connected through the LAN 14.

The manufacturing cell 10 and the manufacturing cell management system 12 according to the embodiment of the present invention basically have the above structure. Hereinafter, a processing flow for abnormality determination (abnormality determination method) will be described.

Each of the manufacturing cells 10 of the manufacturing cell management system 12 produces a workpiece by implementing injection molding under control of the cell side computer 40. Then, at the time of injection molding, the own cell abnormality determination processing unit 44 obtains the physical quantity data Dp of the own manufacturing cell 10A to monitor abnormality in the own manufacturing cell 10A. If abnormality occurs, information about the abnormality is notified to the other manufacturing cell 10B and/or the centralized management computer 16.

Specifically, firstly, the allowable range setting unit 52 of the own cell abnormality determination processing unit 44 sets an allowable range for the physical quantity data Dp and/or the statistical processing data Ds monitored in injection molding (step S10). The allowable range setting unit 52 reads the reference physical quantity data Dp(0) and/or the reference statistical processing data Ds(0) of all of the monitored items, and sets an allowable range for each of the items. It should be noted that the allowable range setting unit 52 may store the preset allowable ranges in the memory 42. In the case where the next injection molding is to be performed under the same molding conditions, the stored allowable ranges may be read from the memory 42.

Then, the physical quantity acquisition unit 48 of the own cell abnormality determination processing unit 44 receives (obtains) signals S from each component at every shot, and stores the physical quantity data Dp in the physical quantity data area 60 (step S11). Further, the statistical processing unit 50 performs at appropriate time statistical processing of the physical quantity data Dp stored in the physical quantity data area 60 to create the statistical processing data Ds, and stores the statistical processing data Ds in the statistical processing data area 62 (step S12).

Thereafter, the allowable range deviation determination unit 54 reads the physical quantity data Dp or the statistical processing data Ds corresponding to the preset allowable range, and determines whether or not the physical quantity data Dp and/or the statistical processing data Ds deviates from the allowable range (step S13). Then, if the physical quantity data Dp or the statistical processing data Ds deviates from the allowable range, the routine proceeds to step S14. If the physical quantity data Dp or the statistical processing data Ds does not deviate from the allowable range, the routine proceeds to step S16.

If the physical quantity data Dp or the statistical processing data Ds deviates from the allowable range (YES in step S13), the data output unit 56 outputs the output information fo to the other manufacturing cell 10B and/or the centralized management computer 16 (step S14). At this time, the data output unit 56 selectively uses the related physical quantity data Dp or the related statistical processing data Ds with reference to the reference table Tr of the extraction data area 64. By extracting the physical quantity data Dp and/or the statistical processing data Ds of the shots before and after the time (or the shot) at which a determination of deviation was made, the output information fo is generated. Therefore, information about the occurrence of abnormality in the own manufacturing cell 10A is shared by the other manufacturing cell 10B and/or the centralized management computer 16.

Further, the determination result notification unit 58 of the own cell abnormality determination processing unit 44 operates the warning light 32, the touch panel 34, and the speaker 36 of the own manufacturing cell 10A to notify the occurrence of abnormality in the own manufacturing cell 10A to the operator (step S15).

Thereafter, (after step S15, NO in step S13), the own cell abnormality determination processing unit 44 determines to finish injection molding (step S16). In the case of finishing injection molding (YES in step S16), since the own cell abnormality determination processing unit 44 finishes its process as well, the obtained physical quantity data Dp and/or statistical processing data Ds is stored and/or deleted as necessary. In the case of continuing injection molding (NO in step S16), the routine returns to step S11, and repeats the processing flow in the same manner.

In the case where the own cell abnormality determination processing unit 44 determines in step S13 that the important physical quantity data Dp and/or the important statistical processing data Ds deviates from the allowable range, or the physical quantity data Dp and/or the statistical processing data Ds deviates significantly from the allowable range, in step S16, the own cell abnormality determination processing unit 44 may forcibly finish operation of the own manufacturing cell 10A. In this manner, when abnormality occurs in the manufacturing cell 10, it becomes possible to stop injection molding immediately.

Further, in each of the manufacturing cells 10, if it is determined that deviation from the allowable range has occurred in the other manufacturing cell 10B (if the output information fo was received), the other cell comparison determination processing unit 46 automatically inspects whether abnormality is inherent to the other manufacturing cell 10B, or similar abnormality also occurs in the own manufacturing cell 10A.

Specifically, the other manufacturing cell data acquisition unit 66 of the other cell comparison determination processing unit 46 obtains the output information fo from the other manufacturing cell 10B at which abnormality occurred, and stores the output information fo in the other manufacturing cell data area 76 (step S20). As a result of reception of this output information fo, the abnormality information determination unit 68 is operated, and the comparison data D' (physical quantity data Dp' or statistical processing data Ds') of the other manufacturing cell 10B at which abnormality occurred is read, and the own data D (physical quantity data Dp or the statistical processing data Ds) of the same item in the own manufacturing cell 10A is read (step S21).

Then, the correlation coefficient calculation unit 68*a* of the abnormality information determination unit 68 uses the read comparison data D' of the other manufacturing cell 10B and the own data D of the own manufacturing cell 10A to calculate the correlation coefficient R (step S22).

Thereafter, the abnormality information determination unit 68 determines whether the calculated correlation coefficient R falls within a predetermined range or falls outside the predetermined range (step S23). If the correlation coefficient R falls within the predetermined range, the routine proceeds to step S24. If the correlation coefficient R falls outside the predetermined range, the routine proceeds to step S25. The abnormality information determination unit 68 uses molding material information fb of the above described molding material data area 78 in addition to determination of abnormality based on the correlation coefficient R. The determination of abnormality may be made, e.g., using the historical data Db in the abnormality data area 80.

If the correlation coefficient R falls within the predetermined range (YES in step S23), correlation between the comparison data D' of the other manufacturing cell 10B at which abnormality occurred and the own data D of the own manufacturing cell 10A is low. Stated otherwise, abnormality of the other manufacturing cell 10B does not occur easily in the own manufacturing cell 10A. It can be said that the abnormality is inherent to the other manufacturing cell 10B. Therefore, the determination result notification unit 70 notifies information to the effect that abnormality does not occur in the own manufacturing cell 10A or there is no sign of abnormality in the own manufacturing cell 10A, e.g., by the touch panel 34 and/or the speaker 36 (step S24). If no abnormality occurs, notification may be omitted, or only information to the effect that an inspection has been performed may be notified. After step S24, the other cell comparison determination processing unit 46 finishes the determination process based on the transmitted output information fo.

If the correlation efficient R falls outside the predetermined range, the correlation between comparison data D' of the other manufacturing cell 10B at which the abnormality occurred and the own data D of the own manufacturing cell 10A is high. Stated otherwise, it can be said that abnormality of the other manufacturing cell 10B indicates some possibility of occurrence of similar abnormality in the own manufacturing cell 10A. Therefore, the abnormality occurrence warning unit 72 of the other cell comparison determination processing unit 46 outputs abnormal occurrence warning information fc to the effect that abnormality occurs also in the own manufacturing cell 10A or there is a sign of abnormality in the own manufacturing cell 10A, to the other manufacturing cell 10B and/or the centralized management computer 16 (step S25). In this manner, in the other manufacturing cell 10B and/or the centralized management computer 16, it is possible to share information about similar abnormality.

Further, the determination result notification unit 70 of the other cell comparison determination processing unit 46 notifies the occurrence of abnormality in the own manufacturing cell 10A or a sign of abnormality in the own manufacturing cell 10A, e.g., by the warning light 32, the touch panel 34, or the speaker 36 (step S26). At this time, the other cell comparison determination processing unit 46 may forcibly stop operation of the own manufacturing cell 10A. Further, after step S26, for example, the other cell comparison determination processing unit 46 stores the physical quantity data Dp and/or the statistical processing data Ds as information about the determined abnormality in the abnormality data area 80, and finishes the determination process based on the transmitted output information fo.

As described above, in the case where the physical quantity data Dp or the statistical processing data Ds deviates from the allowable range, the manufacturing cell 10 and the manufacturing cell management system 12 according to the embodiment of the present invention output the output information fo. In this manner, information about the occurrence of abnormality can be shared by the other manufacturing cell 10B and/or the manufacturing cell management system 12. Further, in the manufacturing cell 10, the abnormality information determination unit 68 and the determination result notification unit 70 determine whether or not abnormality is inherent to the manufacturing cell 10 at which the abnormality occurred, and notify the determination result. In this manner, the occurrence of similar abnormality, the sign of the abnormality, etc. are inspected automatically, and the resulting information can be notified to the operator. In this manner, for example, the workload of the operator for inspection is reduced significantly, and it becomes possible to cope with the abnormality at early time. Further, the manufacturing cell 10 and the manufacturing cell management system 12 can machine the workpiece highly accurately and stably.

In this case, the abnormality information determination unit 68 determines whether the abnormality is inherent to the other manufacturing cell 10B at which the abnormality occurred or the abnormality is similar abnormality, based on the correlation coefficient R. In this manner, it is possible to detect the sign of abnormality at much earlier time. Therefore, it is possible to perform maintenance operation of the plurality of manufacturing cells 10 at an early stage, and suppress manufacturing failures, etc. Further, the abnormality information determination unit 68 extracts and compare the physical quantity data Dp within the predetermined range before and after the time at which the output information fo was outputted, or before and after processing timing at which the abnormality occurred. In this manner, it is possible to reliably determine whether or not the abnormality is inherent to the other manufacturing cell 10B at which abnormality occurred, or the abnormality is similar abnormality.

Moreover, the manufacturing cell 10 includes the abnormality occurrence warning unit 72. Therefore, information about the occurrence of similar abnormality can be shared by the other manufacturing cell 10B or the centralized management computer 16, and the information can be used for determining the cause of abnormality, the maintenance operation, etc. Moreover, the manufacturing cell 10 has the extraction data area 64. Thus, it becomes possible to limit the data as the target of comparison, and outputs the output information fo to the other manufacturing cell 10B and/or the manufacturing cell management system 12. Accordingly, it is possible to achieve reduction of the amount of transferred data, and increase the speed of analysis and determination of the data.

The present invention is not limited to the above described embodiments. It is a matter of course that various modifications can be made without deviating from the gist of the present invention. For example, the own cell abnormality determination processing unit 44 may set an allowable range for at least one item among the physical quantity data Dp and the statistical processing data Ds by the allowable range setting unit 52, and make a determination of deviation of the physical quantity data Dp or the statistical processing data Ds from the allowable range. Further, the manufacturing cell 10 and the manufacturing cell management system 12 establish a network to communicate with the manufacturing cells 10 and the manufacturing cell management systems 12 in other factories. In this manner, it becomes possible to compare and analyze the abnormality of each manufacturing cell 10 in a plurality of factories in an integral manner. Further, the manufacturing cell management system 12 uses data of abnormality occurred in the past, in the abnormality data area 80 to analyze the trend of abnormality in each manufacturing cell 10. For example, this analysis may be used for determination of abnormality, or changing the timing of transmitting notification of maintenance operation to the operator.

Figure 8:
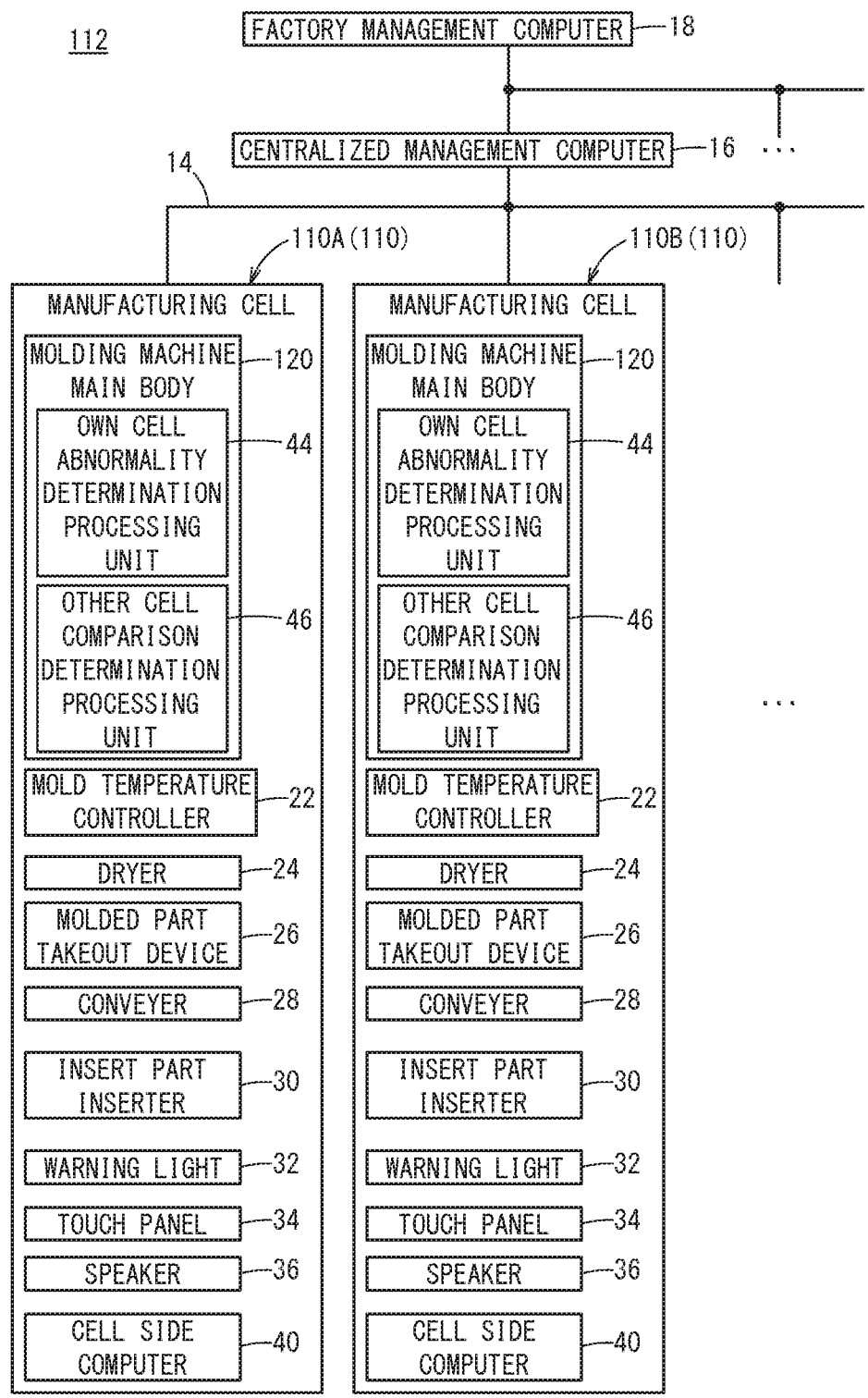
FIG. 8 is a block diagram showing a manufacturing cell and a manufacturing cell management system according to a first modified embodiment.

Further, as an example, FIG. 8 shows a manufacturing cell 110 and a manufacturing cell management system 112 according to a first modified embodiment which is different from the above embodiment in that a control device (not shown) for controlling operation of a molding machine main body 120 has an own cell abnormality determination processing unit 44 and an other cell comparison determination processing unit 46. In this case, the molding machine main body 120 is connected to a molding machine main body 120 of the other manufacturing cell 110B and the centralized management computer 16 through the LAN 14, for sending/receiving information. In this manner, also in the case where determination of abnormality in the own manufacturing cell 10A and determination of comparison with the other manufacturing cell 10B are performed by the control device of the molding machine main body 120, the same advantages can be obtained.

Figure 9:
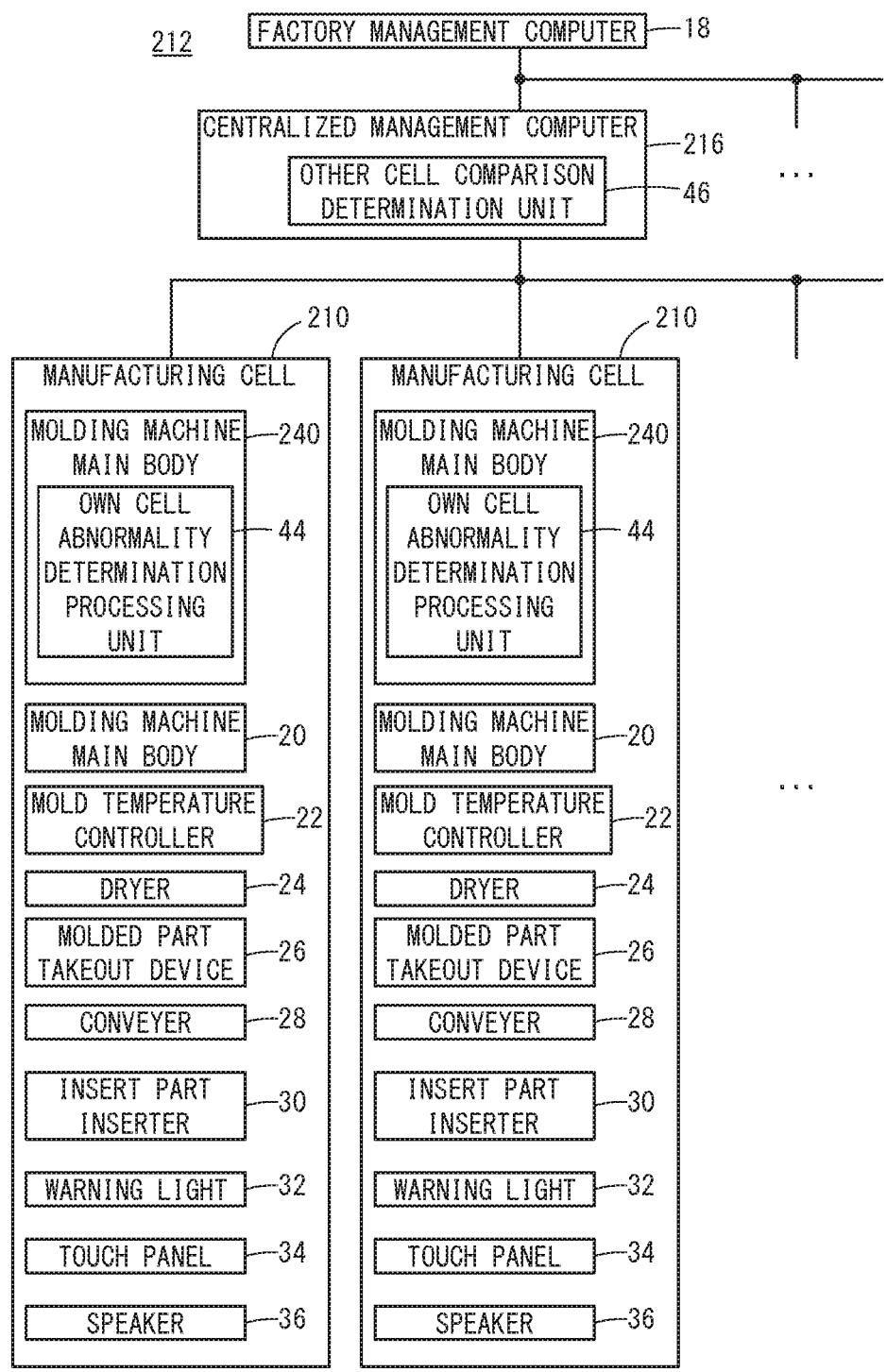
FIG. 9 is a block diagram showing a manufacturing cell and a manufacturing cell management system according to a second modified embodiment.

Further, FIG. 9 shows a manufacturing cell 210 and a manufacturing cell management system 212 according to a second modified embodiment which is different from the above embodiment in that a cell side computer 240 includes an own cell abnormality determination processing unit 44 and a centralized management computer 216 includes an other cell comparison determination processing unit 46. That is, when abnormality occurs in a manufacturing cell 210, the centralized management computer 216 in the manufacturing cell management system 212 determines whether or not the abnormality is inherent to the manufacturing cell 210 at which abnormality occurred, or similar abnormality occurs in the other manufacturing cell 210 in an integrated manner. As described above, in the centralized management computer 216, by determining similarity of abnormality of a plurality of manufacturing cells 210, for example, it becomes possible to manage the manufacturing cells 210 easily, and cope with the abnormality much more promptly.

What is claimed is:

1. A manufacturing cell communicable with another manufacturing cell or a management computer, the manufacturing cell comprising:
   a device configured to physically process a workpiece;
   a memory; and
   a processor configured to
      set an allowable range for at least one of (1) physical quantity data related to the manufacturing cell and (2) statistical processing data obtained by statistically processing the physical quantity data, the statistical processing data being stored in the memory,
      output to said another manufacturing cell or the management computer, output information including at least one of (a) a notification of occurrence of abnormality, (b) the physical quantity data, and (c) the statistical processing data, in a case where the physical quantity data or the statistical processing data deviate from the allowable range,
      when an abnormality occurred in said another manufacturing cell, receive physical quantity data or statistical processing data of said another manufacturing cell contained in output information sent from said another manufacturing cell,
      compare the received physical quantity data or statistical processing data of said another manufacturing cell with the physical quantity data or the statistical processing data of the manufacturing cell, to determine a correlation coefficient,
      automatically make a determination, around a timing when the abnormality occurred in said another manufacturing cell, whether or not the abnormality is inherent to the another manufacturing cell in which the abnormality occurred, by comparing the correlation coefficient with a predetermined range, and
      in response to the correlation coefficient falling outside the predetermined range which indicates a possibility of occurrence of an abnormality in the manufacturing cell similar to the abnormality that occurred in said another manufacturing cell,
      stop operation of the manufacturing cell.

2. The manufacturing cell according to claim 1, wherein the processor is configured to determine whether at least one of the received physical quantity data or statistical processing data deviating from the allowable range of the another manufacturing cell in which the abnormality occurred is similar to the physical quantity data or statistical processing data of the manufacturing cell with no abnormality, based on the correlation coefficient.

3. The manufacturing cell according to claim 1, wherein the processor is configured to compare the received physical quantity data of said another manufacturing cell and the physical quantity data of the manufacturing cell within a predetermined range before and after a time at which the output information was outputted by said another manufacturing cell, or before and after the timing at which the abnormality occurred in said another manufacturing cell.

4. The manufacturing cell according to claim 1, wherein the processor is configured to output abnormality occurrence warning to the another manufacturing cell or the management computer upon determining that an abnormality similar to the abnormality of the another manufacturing cell occurs in the manufacturing cell.

5. The manufacturing cell according to claim 1, wherein the device is an injection molding device, and the processor is configured to obtain molding material information to be used by the processor for determination of abnormality.

6. The manufacturing cell according to claim 1, wherein the memory is further configured to store, as historical physical quantity data or statistical processing data, the received physical quantity data or statistical processing data of the another manufacturing cell in which the abnormality occurred, and
   the processor is configured to compare the historical physical quantity data or statistical processing data stored by the memory with the physical quantity data or statistical processing data of the manufacturing cell to determine the correlation coefficient.

7. The manufacturing cell according to claim 1, wherein the memory is configured to store related data for comparison with data of the another manufacturing cell when the physical quantity data or the statistical processing data of the manufacturing cell deviates from the allowable range, and the processor is configured to output the output information to said another manufacturing cell based on the physical quantity data or the statistical processing data deviating from the allowable range and the related data.

8. A manufacturing cell management system, comprising:

a management computer;

a plurality of manufacturing cells communicatable with each other or with the management computer configured to manage the plurality of manufacturing cells in an integrated manner, each manufacturing cell among the plurality of manufacturing cells comprising a device configured to physically process a workpiece;

a memory; and a processor configured to set an allowable range for at least one of (1) physical quantity data related to each manufacturing cell among the plurality of manufacturing cells and (2) statistical processing data obtained by statistically processing the physical quantity data, and the statistical processing data being stored in the memory, output to another manufacturing cell among the plurality of manufacturing cells or the management computer, output information including at least one of (a) a notification of occurrence of abnormality, (b) the physical quantity data, and (c) the statistical processing data, in a case where the physical quantity data or the statistical processing data of said each manufacturing cell deviate from the allowable ranged, when an abnormality occurred in said another manufacturing cell, receive physical quantity data or statistical processing data of said another manufacturing cell contained in output information sent from said another manufacturing cell, compare the received physical quantity data or statistical processing data of said another manufacturing cell with the physical quantity data or the statistical processing data of said each manufacturing cell, to determine a correlation coefficient, automatically make a determination, around a timing when the abnormality occurred in said another manufacturing cell, whether or not the abnormality is inherent to the another manufacturing cell in which the abnormality occurred, by comparing the correlation coefficient with a predetermined range, and in response to the correlation coefficient falling outside the predetermined range which indicates a possibility of occurrence of an abnormality in said each manufacturing cell similar to the abnormality that occurred in said another manufacturing cell, stop operation of said each manufacturing cell, wherein the management computer includes at least one of the memory and the processor.

9. The manufacturing cell management system according to claim 8, wherein the processor is configured to determine whether at least one of the received physical quantity data or statistical processing data deviating from the allowable range of the another manufacturing cell in which the abnormality occurred is similar to the physical quantity data or the statistical processing data of said each manufacturing cell with no abnormality, based on the correlation coefficient.

10. The manufacturing cell management system according to claim 9, wherein the processor is configured to compare the received physical quantity data of said another manufacturing cell and the physical quantity data of said each manufacturing cell within a predetermined range before and after a time at which the output information was outputted by said another manufacturing cell, or before and after the timing at which the abnormality occurred in said another manufacturing cell.

\* \* \* \* \*